United States Patent [19]

Tsuji

[11] Patent Number: 5,707,051
[45] Date of Patent: Jan. 13, 1998

[54] WAFER STAGE APPARATUS FOR ATTRACTING AND HOLDING SEMICONDUCTOR WAFER

[75] Inventor: Hitoshi Tsuji, Kawasaki, Japan

[73] Assignee: Kabushiki Kaisha Toshiba, Kawasaki, Japan

[21] Appl. No.: 632,325

[22] Filed: Apr. 17, 1996

Related U.S. Application Data

[62] Division of Ser. No. 286,953, Aug. 8, 1994, Pat. No. 5,564,682.

[30] Foreign Application Priority Data

Aug. 13, 1993 [JP] Japan .................. 5-201560

[51] Int. Cl.$^6$ .................................................. B25B 11/00
[52] U.S. Cl. .................................. 269/21; 269/329
[58] Field of Search .................. 269/21, 329; 279/3; 451/388

[56] References Cited

U.S. PATENT DOCUMENTS

| | | | |
|---|---|---|---|
| 3,729,206 | 4/1973 | Cachon et al. | 269/21 |
| 4,131,267 | 12/1978 | Ono et al. | 269/21 |
| 4,684,113 | 8/1987 | Douglas et al. | 269/21 |
| 4,693,458 | 9/1987 | Lewecke et al. | 269/21 |
| 5,249,785 | 10/1993 | Nelson et al. | 269/21 |
| 5,372,357 | 12/1994 | Blaimschein | 269/21 |

FOREIGN PATENT DOCUMENTS

| | | | |
|---|---|---|---|
| 60-127935 | 8/1985 | Japan | 269/21 |

*Primary Examiner*—Robert C. Watson
*Attorney, Agent, or Firm*—Finnegan, Henderson, Farabow, Garrett & Dunner, L.L.P.

[57] ABSTRACT

A wafer stage is provided with a plurality of through holes in its central and peripheral portions. To each of the through holes is coupled an end of a vacuum line the other end of which is coupled to a vacuum pump. With each of the vacuum lines is associated a respective one of electromagnetic valves. A controller controls the timing of opening of the electromagnetic valves. When a wafer placed on the stage is warped so that its central portion is higher than its peripheral portion, the electromagnetic valves associated with the vacuum lines coupled to the peripheral portion of the stage are opened first and the electromagnetic valves associated with the vacuum lines for the central portion of the stage are opened next. When a wafer placed on the stage is warped so that its central portion is lower than its peripheral portion, on the other hand, the electromagnetic valves associated with the vacuum lines coupled to the central portion of the stage are opened first and the electromagnetic valves associated with the vacuum lines for the peripheral portion of the stage are opened next. This permits a greatly warped wafer to be attracted to the stage in a state where it is made flat.

8 Claims, 4 Drawing Sheets

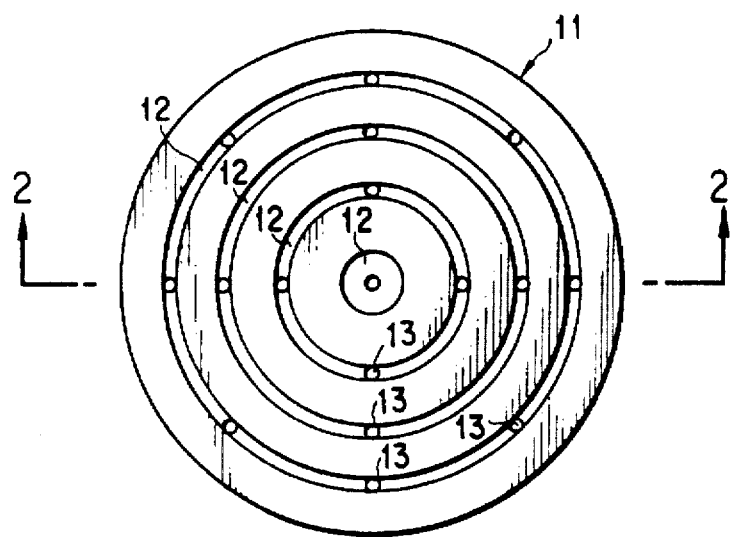
F I G. 1
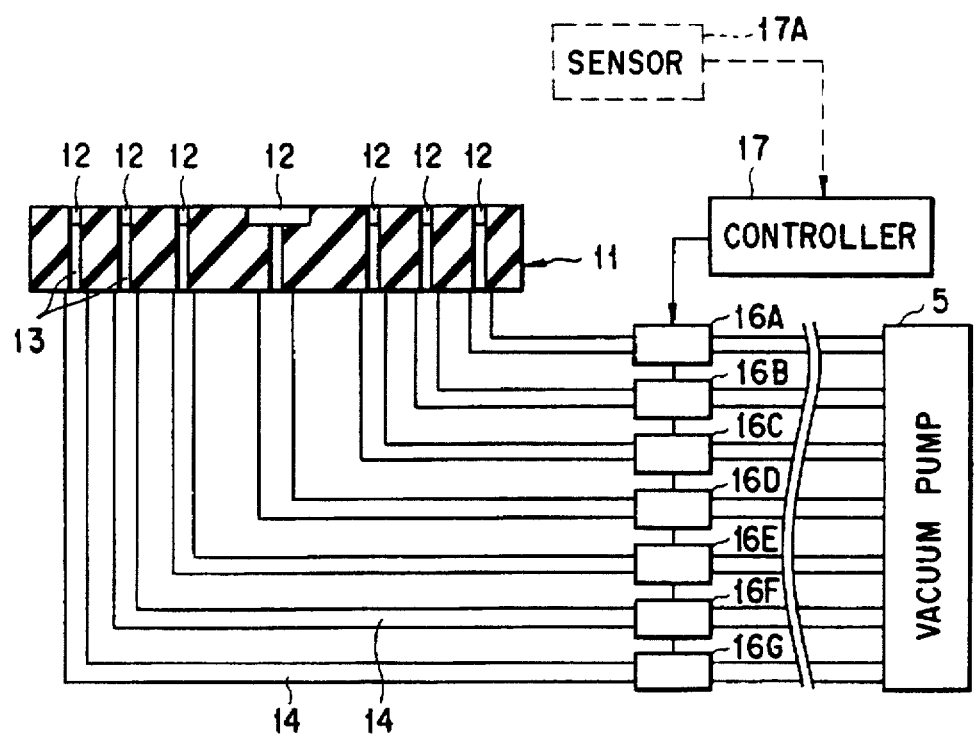
F I G. 2

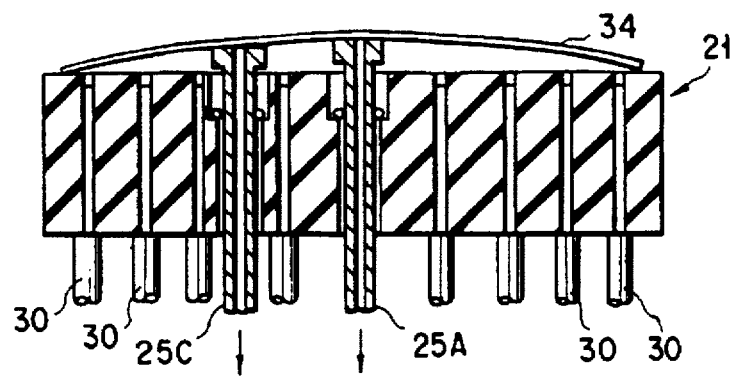
F I G. 7
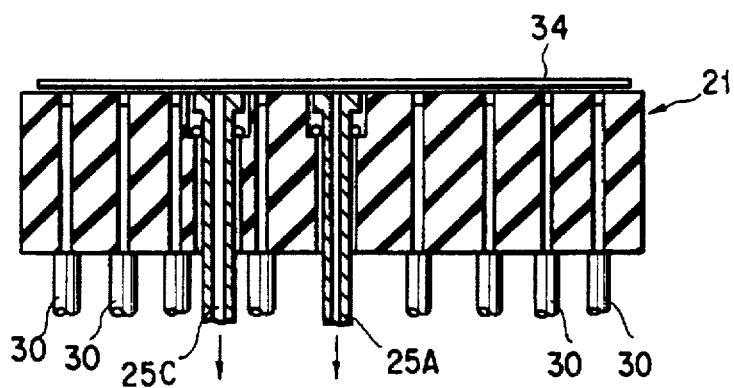
F I G. 8
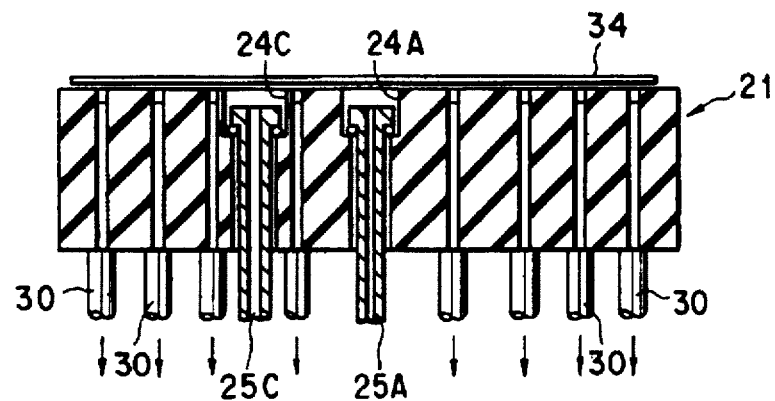
F I G. 9

WAFER STAGE APPARATUS FOR ATTRACTING AND HOLDING SEMICONDUCTOR WAFER

This is a division of application Ser. No. 08/286,953, filed Aug. 8, 1994 now U.S. Pat. No. 5,564,682.

BACKGROUND OF THE INVENTION

1. Field of the Invention

The present invention relates to a wafer stage for use in a semiconductor manufacturing apparatus which attracts and holds a semiconductor wafer.

2. Description of the Related Art

A semiconductor manufacturing apparatus for subjecting a semiconductor wafer to processes of exposing, etching, or the like is equipped with a stage that attracts and fixes the wafer. In processing a wafer by means of this type of semiconductor manufacturing apparatus, the wafer is taken out of a wafer carrier, then carried by a conveyer belt and shifted onto the stage by a handler. The stage is provided with a plurality of vacuum lines. Thus, the wafer placed on the stage is fixed on the stage by vacuum chucks.

It is preferable that wafers should have little warp. Recent wafers are made large in diameter and coated previously with a film for improving their properties. When wafers are formed on their surface with a thick film or subjected to heat treatment at a high temperature, they can warp downward or upward to the extent of tens of micrometers to 250 micrometers.

When there is a warp in a wafer, a conventional vacuum chuck causes a leak error, failing to fully attract the wafer to the stage. For this reason, the subsequent processing cannot be performed. If, although the wafer can be attracted to the stage, the attraction is incomplete, it is difficult to eliminate the warp in the wafer. If the wafer cannot be fixed completely on the stage, various problems will arise, depending on the type of apparatus to which the stage is applied. If, for example, the stage is used in an exposure system, a warped wafer will result in out-of-focus of exposing beams in different positions on the wafer surface. This will reduce the resolution of a pattern formed on the wafer. If, on the other hand, the stage is used in an etching apparatus, the wafer, when subjected to cooling, will be cooled unevenly, depending on places on its surface.

SUMMARY OF THE INVENTION

It is accordingly an object of the present invention to provide a wafer stage apparatus which permits a wafer to be fixed securely to thereby eliminate a warp in the wafer.

The object of the present invention is achieved by a wafer stage apparatus comprising:

a stage formed with a plurality of through holes adapted to attract a wafer placed on the stage;

a plurality of vacuum lines having their one ends coupled to the through holes and their other ends coupled to a vacuum pump;

breaking means, each provided at an intermediate portion of a respective one of the vacuum lines, for breaking and opening the vacuum lines; and control means for controlling the timing of opening of the breaking means in accordance with a warp in the wafer.

According to the wafer stage apparatus of the present invention, the control means controls the timing of opening of the breaking means to thereby control the timing of attracting of the wafer by the vacuum lines communicating with the through holes in the stage. Thus, even a greatly warped wafer can be attracted to the stage securely in a state where it is made flat.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view of a wafer stage and illustrates a first embodiment of the present invention;

FIG. 2 is a section taken along line 2—2 in FIG. 1, wither parts of the first embodiment added;

FIG. 7 is a diagram for use in explanation of the operation of the second embodiment;

FIG. 8 is a diagram for use in explanation of the operation of the second embodiment; and FIG. 9 is a diagram for use in explanation of the operation of the second embodiment.

DETAILED DESCRIPTION OF THE PREFERRED EMBODIMENTS

Figure 3:
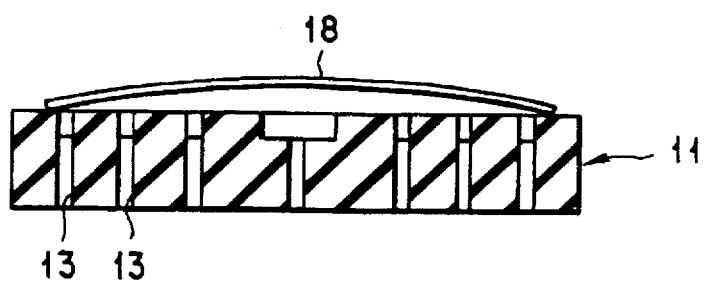
FIG. 3 is a diagram for use in explanation of the operation of the first embodiment.

Referring now to FIGS. 1 and 2 illustrating a first embodiment of the present invention, a stage 11 is formed on top with a plurality of concentric grooves 12. In each of the grooves 12, a plurality of through holes 13 are formed at regularly spaced intervals. To the rear side of the stage 11 are coupled the ends of vacuum lines 14, each of which is formed of, for example, a pipe and communicates with a respective one of the through holes 13. The other ends of the vacuum lines 14 are coupled to a vacuum pump 15. The vacuum lines 14 are provided with electromagnetic valves 16A through 16G in their respective intermediate portions. These electromagnetic valves are switched on or off by a controller 17. Although FIG. 2 shows electromagnetic valves only for vacuum lines on the line 2—2 in FIG. 1, the other vacuum lines are likewise provided with electromagnetic valves.

Next, the vacuum-chucking sequence in the above arrangement will be described. Suppose here that on the stage 11 is placed a wafer 18 that warps upward such that its central portion is higher than its peripheral portion. In chucking such a wafer, the wafer is attracted to the stage in such a manner that its peripheral portion is attracted first and its central portion is attracted last.

Figure 4:
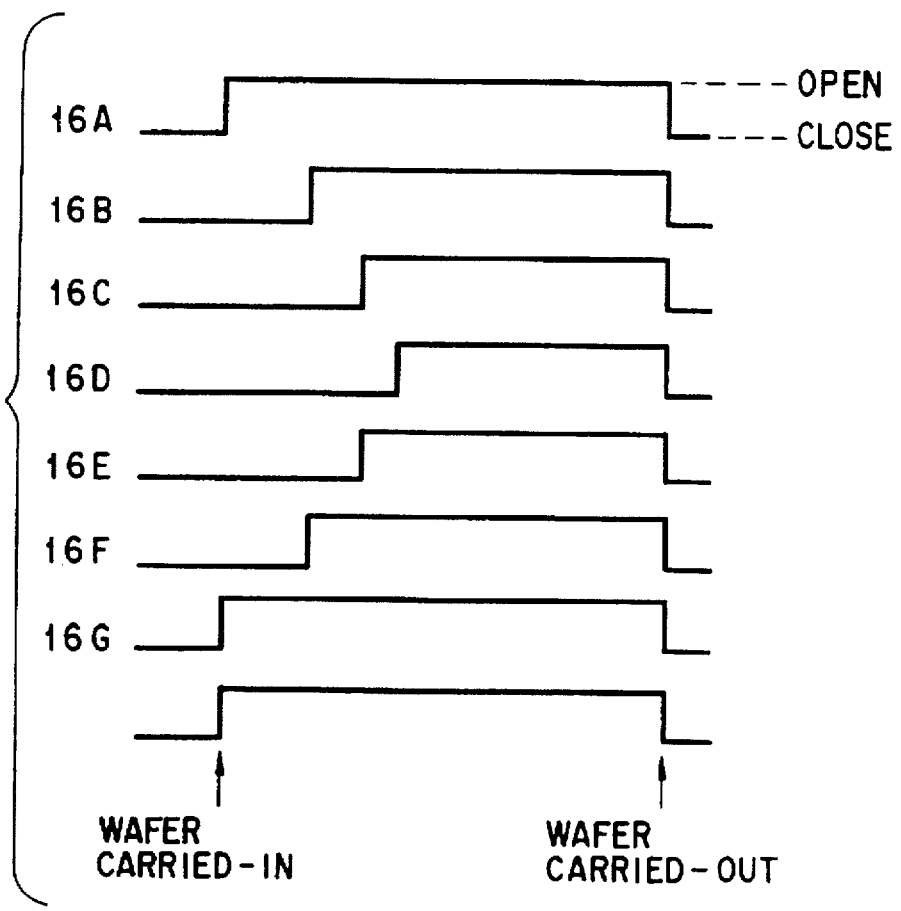
FIG. 4 is a timing diagram which is useful in understanding the operation of the first embodiment.

That is, when the wafer is placed on the stage 11, the electromagnetic valves 16A and 16G associated with the vacuum lines 14 located in the peripheral portion of the wafer are opened first by the controller 17 and the electromagnetic valves 16B and 16F associated with the inward pipes are opened next as shown in FIG. 4. Then, the electromagnetic valves 16C and 16E are opened. Finally, the electromagnetic valve 16D associated with the pipe in the central portion of the wafer is opened. when the electromagnetic valves 16A and 16G are opened to thereby attract the peripheral portion of the wafer to the stage 11, the central portion of the wafer 18 is lowered slightly. When the valves 16C and 16E are opened in this state, the central portion of the wafer is further lowered. When the valve 16D is opened finally, the central portion of the wafer is attracted to the stage 11. Thus, the wafer can be securely attracted to the stage, permitting a warp in the wafer to be eliminated.

In contrast, to attract a wafer that is warped downward such that its outermost portion is higher than its central portion, the sequence is reversed. That is, the electromagnetic valve associated with the central portion of the wafer is opened first, and the electromagnetic valves for those portions of the wafer which are outside the central portion are opened next. Finally, the electromagnetic valves associated with the outermost portion of the wafer are opened. Thus, the wafer is attracted to the stage in such a manner that its central portion is attracted first and its outermost portion is attracted last.

The direction in which the wafer is warped can be sensed in advance, in which case the result is entered into the controller 17. Alternatively, as shown in FIG. 2, a sensor 17A may be provided in the neighborhood of the stage, which is adapted to sense the direction of warp in the wafer. The result of this sensing operation is entered into the controller 17. By way of example, the sensor irradiates the wafer surface with light and detects an angle of light reflected from the wafer, thereby sensing the direction of warp in the wafer. The controller 17 controls the electromagnetic valves in the above-described manner on the basis of the direction of wafer's warp thus sensed.

When a process of exposing or etching the wafer thus attracted to the stage is terminated, the electromagnetic valves 16A through 16G are closed simultaneously. Then, the wafer is released from vacuum chucking, permitting the wafer to be carried out.

According to the above embodiment, the wafer attraction sequence is changed according to a warp in a wafer. This permits even a wafer that is greatly warped upward or downward to be securely attracted and fixed to the stage, thus eliminating the wafer warp and making the wafer flat. Thus, application of this wafer stage to an exposure system will prevent the resolution of a pattern formed on a wafer from becoming lowered. In the case of an etching apparatus, on the other hand, a wafer will be cooled evenly.

The wafer stage apparatus, which is adapted to attract a wafer in accordance with the above-described sequence, can reduce the time it takes to attract a greatly upward warped wafer in particular. In addition, this apparatus can attract even a wafer that is warped more than 200 micrometers, providing a significant advantage in practical use.

Figure 5:
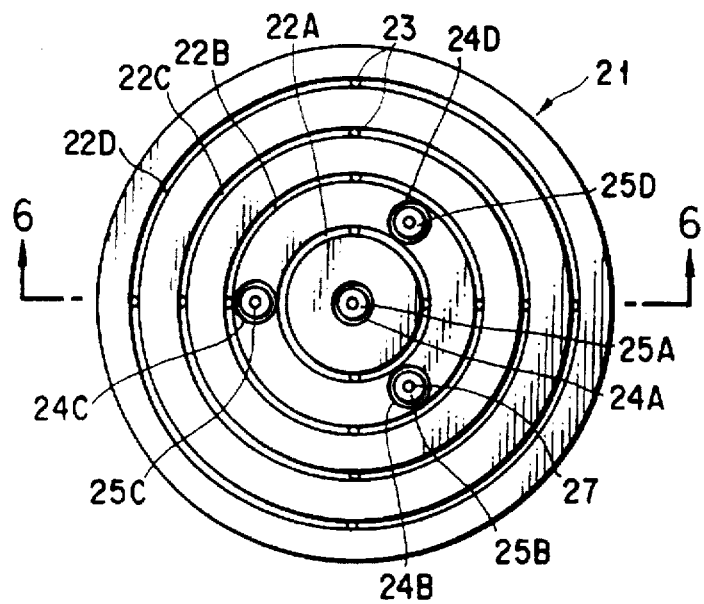
FIG. 5 is a plan view of a water stage and illustrates a second embodiment of the present invention.
Figure 6:
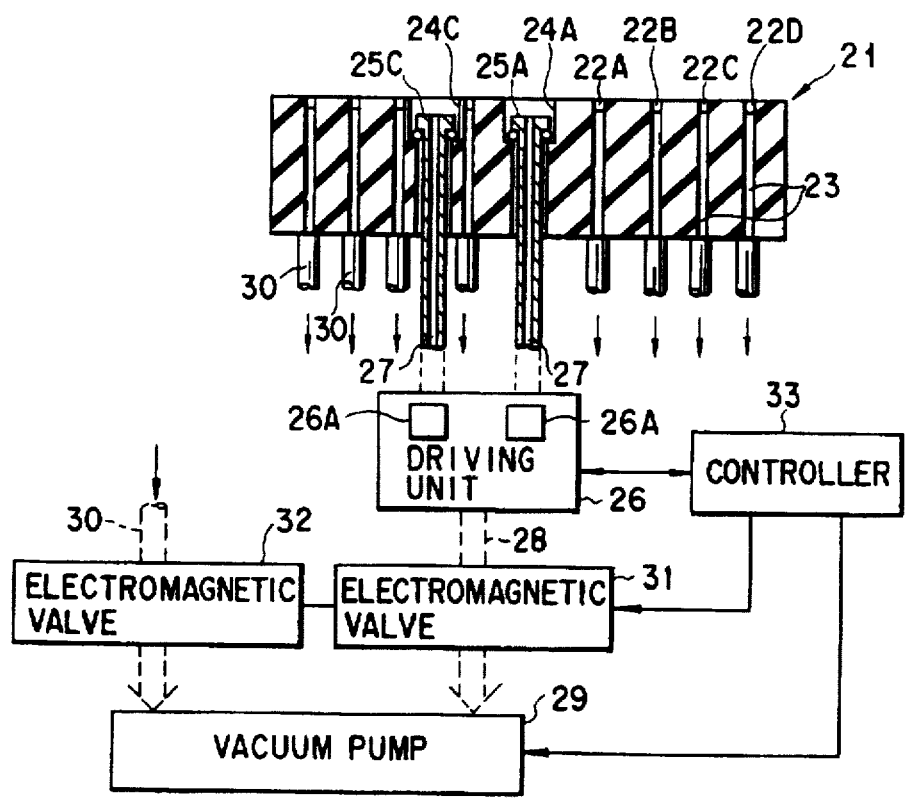
FIG. 6 is a section taken along line 6—6 in FIG. 5, with other parts of the second embodiment added.

Referring now to FIGS. 5 and 6 there is shown a second embodiment of the present invention.

A stage 21 is formed on top with a plurality of concentric grooves 22A through 22D. In each of these grooves a plurality of through holes 23 are formed at regularly spaced intervals. A plurality of recesses 24A through 24D are provided in the center of the stage 21 and between the grooves 22A and 22B. Wafer chucks 25A through 25D are provided movably within the recesses 24A through 24D, respectively. These wafer chucks are connected to a driver 26, which comprises a linear motor by way of example, and can be moved individually by that driver. The driver 26 is equipped with a plurality of pressure sensors 26A. Each of the pressure sensors 26A is associated with the shaft of a respective one of the wafer chucks 25A through 25D. Each pressure sensor 26A senses the position to which the corresponding wafer chuck is moved up. Each of the pressure sensors is provided with a through hole 27, which is connected by a vacuum line 28 to a vacuum pump 29. Likewise, the through holes 23 in the stage 21 are connected to the vacuum pump 29 by vacuum lines 30. The vacuum lines 28 and 30 are provided in their intermediate portions with electromagnetic valves 31 and 32. The operation of the electromagnetic valves 31 and 32 and the driver 26 is controlled by a controller 33, into which information indicating the direction of wafer's warp has been entered previously. As in the first embodiment, this information may be generated by a sensor placed in the neighborhood of the stage.

The number of the electromagnetic valves is not limited to two. As many electromagnetic valves as there are vacuum lines may be provided. In this case, the electromagnetic valves may be controlled individually.

The vacuum-chucking sequence for the second embodiment described above will be described with reference to FIGS. 7 to 9.

Suppose now that on the stage 21 is placed a wafer 34 that is warped upward so that its central portion is higher than its peripheral portion. Under the control of the controller 33 the driver 26 is first operated to move the wafer chucks 25A through 25D up. Each of the chucks will be stopped when it abuts the wafer 34. The pressure sensors 26A senses where the wafer chucks 25A through 25D have been moved up to. That is, when each of the wafer chucks abuts the wafer, the load on the corresponding pressure sensor 26A increases more than usual, changing an output signal of that sensor. It is therefore required that the wafer chuck be stopped at this point. Thus, the wafer chucks can be stopped when they abut the wafer, i.e., in respective positions conforming to a warp in the wafer. The electromagnetic valve 31 is opened in this state, so that the wafer 34 is attracted to the wafer chucks 25A through 25D.

Subsequently, the wafer chucks 25A to 25D are moved down, then stopped as shown in FIG. 8 in a state where the surface of each of the wafer chucks is flush with the surface of the stage 21. The order in which the wafer chucks 25A through 25D are moved down depends on the direction of a warp in the wafer. When the wafer is warped upward as shown in FIG. 7, the peripheral wafer chucks 25B through 25D are first moved down, and the wafer chuck 25A placed in the center of the stage is then moved down. Conversely, when the wafer is warped downward, the wafer chuck in the center of the stage is first moved down and the peripheral wafer chucks are then moved down. Whether the wafer is warped upward or downward can be known from outputs of position sensors which are provided in the neighborhood of the wafer chucks 25B through 25D and sense where the respective wafer chucks are moved up to.

When the electromagnetic valve 32 is opened in a state where the wafer 34 is made flat by force, the wafer 34 is attracted to the stage 21. After that, the electromagnetic valve 31 is closed, so that the wafer chucks 25A through 25D leave the wafer 34 and are moved down to the bottom of the recessed portions 24A through 24D as shown in FIG. 9.

After a process of exposure or etching is performed on the wafer attracted to the stage, the electromagnetic valve 32 is closed, thereby releasing the wafer from vacuum chucking and permitting it to be carried out.

According to the second embodiment, since the wafer chucks 25A through 25D are permitted to move independently, they can be moved to conform to a warp in a wafer to thereby attract the wafer. Thus, the occurrence of a vacuum error can be avoided because even a wafer that is greatly warped can be made flat by force and attracted to the stage 21. As with the first embodiment, therefore, the second embodiment can prevent the resolution of an exposed pattern from being lowered in the case where the stage is applied to an exposure system and can prevent the wafer from being cooled unevenly in the case where the stage is used in an etching apparatus.

What is claimed is:

1. A wafer stage apparatus comprising:

a stage provided with a plurality of first through holes for attracting a wafer placed on its surface;

a plurality of wafer attracting means placed in central and peripheral portions of said stage, each of said wafer attracting means having a second hole for attracting said wafer and being movable up and down so that it can project from the surface of said wafer;

driving means for driving said wafer attracting means individually, said driving means bringing said wafer attracting means into contact with said wafer placed on said stage;

a plurality of first vacuum lines each of which has its one end coupled to a respective one of said first through holes and its other end coupled to a vacuum pump;

a plurality of second vacuum lines each of which has its one end coupled to a respective one of said second through holes and its other end coupled to a vacuum pump;

first breaking means, each of which is provided in the intermediate portion of a respective one of said first vacuum lines, for breaking and opening said first vacuum lines;

second breaking means, each of which is provided in the intermediate portion of a respective one of said second vacuum lines, for breaking and opening said second vacuum lines; and control means responsive to a warp in said wafer for controlling the distance through which said wafer attracting means are moved up by said driving means and the timing of opening of said first and second breaking means.

2. The apparatus according to claim 1, wherein said control means has information indicating the direction in which said wafer is warped stored previously therein and controls the order of closing of said first and second breaking means accordingly.

3. The apparatus according to claim 1, further comprising a sensor provided in the neighborhood of said stage for sensing the direction of a warp in said wafer and informing said controller of the direction of said warp thus sensed.

4. The apparatus according to claim 1, wherein said driving means is equipped with a pressure sensor which is responsive to a change in pressure to detect that said wafer attracting means is brought into contact with said wafer.

5. A wafer stage apparatus comprising:

a stage provided with a plurality of first through holes for attracting a wafer placed on its surface;

a plurality of wafer attracting means placed in central and peripheral portions of said stage, each of said wafer attracting means having a second hole for attracting said wafer and being movable up and down so that it can project from the surface of said wafer;

driving means for driving said wafer attracting means individually, said driving means bringing said wafer attracting means into contact with said wafer placed on said stage;

a plurality of first vacuum lines each of which has its one end coupled to a respective one of said first through holes and its other end coupled to a vacuum pump;

a plurality of second vacuum lines each of which has its one end coupled to a respective one of said second through holes and its other end coupled to a vacuum pump;

first valves, each of which is provided in the intermediate portion of a respective one of said first vacuum lines, for breaking and opening said first vacuum lines;

second valves, each of which is provided in the intermediate portion of a respective one of said second vacuum lines, for breaking and opening said second vacuum lines; and control means for, when said wafer has its central portion higher than its peripheral portion, opening said second valves to permit said wafer attracting means to attract said wafer and said driving means to move said wafer to the position of contact with said stage and opening said first valves to attract said wafer to said stage.

6. The apparatus according to claim 5, wherein said control means has information indicating the direction in which said wafer is warped stored previously therein and controls the order of closing of said first and second valves accordingly.

7. The apparatus according to claim 5, further comprising a sensor provided in the neighborhood of said stage for sensing the direction of a warp in said wafer and informing said controller of the direction of said warp thus sensed.

8. The apparatus according to claim 5, wherein said driving means is equipped with a pressure sensor which is responsive to a change in pressure to detect that said wafer attracting means is brought into contact with said wafer.

* * * * *